Figure 1:
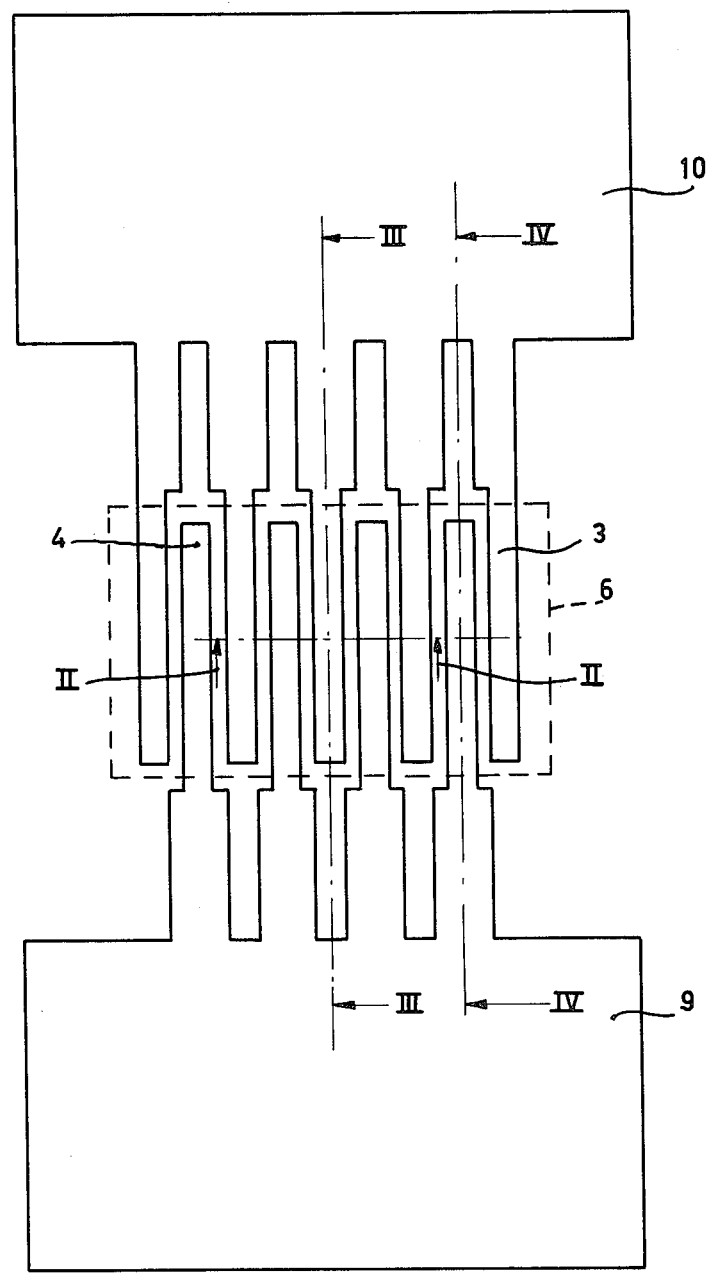

United States Patent [19]

Symersky

[11] 4,078,963
[45] Mar. 14, 1978

[54] METHOD OF MANUFACTURING A SEMICONDUCTOR DEVICE, HAVING A PATTERN OF CONDUCTORS ON A SUPPORTING BODY

[75] Inventor: Bohuslav Symersky, Nijmegen, Netherlands

[73] Assignee: U.S. Philips Corporation, New York, N.Y.

[21] Appl. No.: 735,194

[22] Filed: Oct. 26, 1976

Related U.S. Application Data

[63] Continuation of Ser. No. 525,650, Nov. 20, 1974, abandoned.

[30] Foreign Application Priority Data

Dec. 10, 1973 Netherlands .......................... 7316851

[51] Int. Cl.² ................................................ C23F 1/02
[52] U.S. Cl. ...................................... 156/652; 29/580; 156/656; 156/659
[58] Field of Search ............... 156/652, 656, 659, 661, 156/664; 29/571, 578, 579, 580, 591; 357/41, 46

[56] References Cited

U.S. PATENT DOCUMENTS 3,866,310   2/1975   Driver et al. ......................... 29/571

Primary Examiner—William A. Powell
Attorney, Agent, or Firm—Frank R. Trifari; Jack E. Haken

[57] ABSTRACT

A method of manufacturing a device, preferably a semiconductor device, having a pattern of conductors provided on a substrate. According to the invention a pattern of conductors with very fine details can be obtained by providing the pattern in at least two parts and at least two steps, in which in each step an auxiliary layer is provided over the assembly which is patterned so as to correspond with the negative of the part of the pattern of conductors to be provided, after which a conductive layer is provided over the assembly and at least a part of the auxiliary layer with the part of the conductive layer present thereon is then removed.

21 Claims, 18 Drawing Figures

METHOD OF MANUFACTURING A SEMICONDUCTOR DEVICE, HAVING A PATTERN OF CONDUCTORS ON A SUPPORTING BODY

This is a continuation, of application Ser. No. 525,650, filed Nov. 20, 1974, now abandoned.

The invention relates to a method of manufacturing a device having a supporting body comprising a pattern of conductors, in which method an auxiliary layer which has one or more apertures which correspond to at least a part of the pattern to be provided is provided on a surface of the body, after which an electrically conductive layer of a material differing from that of the auxiliary layer is provided on the auxiliary layer and in the apertures, and at least the upper part of the auxiliary layer with the part of the conductive layer present thereon is then removed selectively, the part of the conductive layer remaining in the apertures forming part of the pattern of conductors.

The invention furthermore relates to a device manufactured by using said method.

Several methods have been developed for providing a pattern of conductors on a supporting body, in which the range of applications of each of the said methods depends upon the requirements imposed upon the pattern of conductors.

A first method which has so far most frequently been used and is used, for example, to provide the emitter- and base metallization on transistors and to provide the whole pattern of contact layers and connection conductors on monolithic or hybrid integrated circuits, consists of the provision, for example by vapour deposition, of a conductive layer, generally a metal layer, on a surface of a supporting body, for example, on the surface of a semiconductor body and on the insulating layer or layers usually present thereon, after which the metal layer is removed by a photolithographic etching process with the exception of the areas to be metallized. For that purpose of lacquer layer which is sensitive to radiation, for example, to light radiation or to electron radiation, is provided on the metal layer, which lacquer layer is then exposed according to the desired pattern, in general via a mask, in which the exposed parts of the lacquer layer become soluble, whereas the non-exposed parts remain insoluble, or conversely. The soluble parts of the lacquer layer are then removed and the parts of the metal layer so exposed are removed by etching. Generally a certain extent of underetching of the metal layer to below the edges of the etching mask formed by the lacquer layer occurs, which imposes restrictions upon the extent to which fine details can be realized in the pattern of conductors, for example, the mutual distance and the width of the metal tracks to be provided. A further restriction of said method resides in the fact that the choice of the metal to be used is restricted and is inter alia determined by the adhesion of the metal to the supporting member, in the above case to the semiconductor surface and to the insulating layers present thereon, as well as by the etchability of the metal and in particular its selective etchability with respect to the lacquer mask and the other materials present.

These drawbacks are avoided at least partly by using another likewise known method in which on a surface of the body an auxiliary layer is provided in which apertures are provided, for example, by means of a photolithographic method, which apertures correspond to a pattern of conductors to be provided, after which a conductive layer of a material differing from that of the auxiliary layer is provided in the apertures and on the auxiliary layer. By subsequently removing selectively, for example, by etching, at least a part of the auxiliary layer with the part of the conductive layer present thereon, the desired pattern of conductors remains in the apertures.

This method has the important advantage that one is substantially not restricted in the choice of the material to be used for the pattern of conductors, so that this may be chosen entirely in agreement with the electrical and mechanical requirements imposed, for example, conductivity, adhesion to the underlying surface, and so on. However, as in the above-described method, the provision of fine details in the pattern of conductors below a certain limit is very difficult in practice also when said method is used. For example, the smallest possible mutual distance of two metal tracks is determined inter alia by the thickness of the auxiliary layer and by the processes to which the auxiliary layer is subjected by the method, the thickness of the auxiliary layer being determined inter alia by the thickness of the metallization. This smallest possible distance in general is at least a few microns, which is too much for certain applications.

One of the objects of the invention is to provide a method in which the dimensions of the pattern of conductors to be provided can be considerably refined and in which in particular layer parts can be obtained which are situated very close together, while maintaining the advantages associated with the last-mentioned method.

The invention is based inter alia on the recognition that the end in view can be achieved by a repeated use of the last-mentioned method.

According to the invention, a method of the type described in the preamble is therefore characterized in that, after removing a first auxiliary layer with the part of a first conductive layer present thereon whereby a first part of the pattern of conductors is obtained, a second auxiliary layer of a material differing from that of the first conductive layer and having one or more further apertures which correspond to a second part of the pattern of conductors is provided over the assembly, that a second conductive layer of a material differing from that of the second auxiliary layer is provided over said second auxiliary layer and in said further apertures, and that at least the upper most part of the second auxiliary layer with the part of the second conductive layer present thereon is then removed selectively, the part of the second conductive layer remaining in the further apertures forming a second part of the pattern of conductors.

One of the important advantages resulting from the use of the invention is that the smallest realizable distance between two parts of the pattern of conductors is no longer determined by factors relating to the thickness of the auxiliary layer and the processes applied thereto, but, besides on the accuracy of the photolithographic methods used, depends substantially only on the accuracy with which the mask which defines the second part of the pattern of conductors can be aligned relative to the previously obtained first part of the pattern of conductors. This can be done with great accuracy so that apertures, slots, and so on in the pattern of conductors with smallest dimensions of 1 micron or less can be realized with high reproducibility. The conductive layer which forms the second part of the pattern of conductors may be separated entirely from the first conductive layer. If desired, however, the second conductive layer may partly overlap the first in projection, in which inter alia the mask used for providing the second conductive layer may be less critical.

A further important advantage of the invention is that the first and the second part of the pattern of conductors may be of different compositions and/or thicknesses. As a result of this the various parts of the pattern may be adapted to the requirements imposed upon them independently of each other. For example, the emitter metallization which is to conduct comparatively high currents may consist of another metal or metals and/or be thicker than the base metallization through which much lower currents flow.

According to an important preferred embodiment of the invention a first and/or a second auxiliary layer of metal is provided. This may be a simple auxiliary layer or an auxiliary layer composed of several layers provided one on top of the other, in which each layer may consist of a single metal of an alloy. Such an auxiliary layer can be provided in a simple manner, for example, by vapour deposition or sputtering and can withstand relatively high temperatures. As a result of this, when using a metal auxiliary layer, the pattern of conductors may be provided at an elevated temperature. The adhesion of the pattern of conductors to the substrate is promoted thereby, and in the case of the provision of a pattern of conductors on a semiconductor body the electrical properties of the conductor — semiconductor contact is also promoted. Furthermore, the etching away of a metal auxiliary layer is also often promoted by the occurrence of electrochemical (galvanic) effects.

The auxiliary layer may consist of a layer of one single material. Upon providing the conductive layer over the auxiliary layer, however, a connection is generally formed between the part of the conductive layer provided in the apertures in the auxiliary layer and the part present on the auxiliary layer, which connection is to be interrupted when removing the auxiliary layer, which sometimes is very difficult and as a result of which irregular contours may arise in the pattern of conductors. This drawback can be avoided, if, according to a preferred embodiment of the method, at least the second auxiliary layer comprises a third and a fourth component auxiliary layer of mutually different materials, the third component auxiliary layer consisting of a metal which is soluble in an etchant which does substantially not attack the second conductive layer and is present between the surface of the body and the fourth component auxiliary layer, in which upon making the apertures in the second auxiliary layer the apertures in the third component auxiliary layer become larger than those in the fourth component auxiliary layer as a result of underetching (or undercutting). When the second conductive layer is provided, for example by vapour deposition, no or only a very weak connection is then generally formed between the parts of the conductive layer in the apertures and on the auxiliary layer as a result of the presence of the underetching, so that tearing and the consequently easily caused irregularities in the edges of the pattern of conductors are avoided.

This advantage is obtained for both parts of the pattern of conductors if, according to a further preferred embodiment, the first auxiliary layer also comprises a first and a second component auxiliary layer of mutually different materials, in which the first component auxiliary layer consists of a metal which is soluble in an etchant which does substantially not attack the first conductive layer and is present between the surface of the body and the second component auxiliary layer, in which upon making the apertures in the first auxiliary layer the apertures in the first component auxiliary layer become larger than those in the second component auxiliary layer as a result of underetching.

An important preferred embodiment is characterized in that after the removal of the first auxiliary layer, an insulating layer is provided over the assembly on which the second auxiliary layer is then provided. As a result of this a very compact pattern of conductors can be provided, in which the first and the second part of the pattern of conductors overlap each other partly in projection without contacting each other; this may be of importance, for example, for electrode configurations in charge-coupled shift registers.

In certain circumstances it may be of advantage that at least the first auxiliary layer is removed only partly, the non-removed part also forming part of the pattern of conductors. A further preferred embodiment is characterized in that a first component auxiliary layer of an electrically conductive material is provided which contacts surface parts of the supporting body and that the first component auxiliary layer is not removed at least on said surface parts and forms a further part of the pattern of conductors.

The conductive layers may be provided in various manners, for example, by chemical or electrochemical deposition from a solution. Preferably, however, the conductive layers which form the pattern of conductors are provided from the gaseous phase under a reduced pressure and in a direction transverse to the surface, for example, by vapour deposition, sputtering or by decomposition of a gaseous compound. As a result of this the thickness of the provided conductive layer on the edges of the apertures becomes smaller so that the parts of the semiconductor layer to be removed detach more easily from the parts provided in the apertures.

The conductive layers may consist of a single metal layer or of a composite layer which comprises several metals present one on top of the other. A conductive layer may also be formed by a, preferably highly doped, semiconductor layer, for example, of polycrystalline silicon.

At least the second auxiliary layer, and preferably each auxiliary layer, preferably has a thickness which is larger than that of the conductive layer or layers provided thereon. When providing the conductive layer on the auxiliary layer, for example by vapour deposition, the conductive layer becomes very thin on the edge of the apertures and the separation of the conductive layer present on the auxiliary layer from the conductive layer present in the apertures is facilitated.

When a multiple composite auxiliary layer is used on providing the first and/or the second part of the pattern of conductors, the uppermost (so the said second and/or the fourth) component auxiliary layer preferably is a metal layer which serves as an etching mask for the underlying (first and/or third, respectively) component auxiliary layer when making the apertures in the auxiliary layer. As a result of this the pattern of the apertures may be defined very accurately, in particular when the uppermost component auxiliary layer is thin with respect to the underlying component auxiliary layer. As a result of this, actually, the underetching which occurs when the uppermost component auxiliary layer is brought in the desired shape can be minimum so that very fine details can be realized.

Upon choosing the materials for the various auxiliary layers or component auxiliary layers, several considerations play a part, inter alia (the selective) etchability with respect to the pattern of conductors, the mechanical strength and the adhesion to the substrate. In this connection a first and/or third component auxiliary layer of aluminium, copper, silver or magnesium is advantageously provided, while a layer of chromium, titanium, palladium, molybdenum, tungsten, tantalum, nickel or gold is preferably provided as a second and/or as a fourth component auxiliary layer.

By using the invention, the possibility is also created to provide a second conductive layer so as to form the second part of the pattern of conductors, which layer is different from the first conductive layer, either different in thickness, or different in composition, or both. As a result of this, various parts of a pattern of conductors which each have a different function, for example the emitter metallization and the base metallization of a transistor, upon which different requirements are imposed as regards current conductivity, can each be adapted optimally to said requirements in a simple manner.

One of the said conductive layers, or both layers, may be composed of at least two conductive component layers of different materials which are situated on top of each other. One of the advantages of this is that the lower component layer can be entirely adapted to the requirements imposed upon the adhesion to and the contact with the substratum, while the uppermost component layer can be adapted to quite different requirements, such as good solderability and conductibility. In connection herewith, gold is advantageously used as the uppermost conductive component layer and titanium, chromium, rhodium, zirconium, tantalum, tungsten or molybdenum is advantageously used as the lower conductive component layer. These latter metals have good adhesion properties, in particular on semiconductor surfaces and on the insulating layers usually present thereon, for example silicon oxide, and silicon nitride, in particular if they are provided at elevated temperature. If they are of a sufficient thickness they also form a suitable barrier between a semiconductor surface and a gold layer so as to prevent diffusion of gold in the semiconductor body.

According to a further preferred embodiment, prior to providing the gold layer but after providing a chromium layer or titanium layer, a layer of platinum or rhodium is provided. Such a layer provides a good screening between gold and semiconductor surfaces already with a very small thickness, so that thinner conductive layers may be used which enable a better definition of the pattern of conductors, in which the titanium or chromium only serves for adhesion and may therefore be comparatively thin.

The said pattern of conductors may be provided on any supporting member to be considered for that purpose, for example, on an insulating supporting body, as transducer electrodes on a piezo electric support, or otherwise. However, the invention is used particularly advantageously for providing patterns of conductors on a semiconductor surface. In most of the cases the pattern of conductors is advantageously provided partly on an insulating layer present on the semiconductor surface and partly in one or more apertures present in the insulating layer.

A first part of the pattern of conductors advantageously forms the base metallization, while a second part of the pattern of conductors forms the emitter metallization of a transistor.

The invention furthermore relates to a device, preferably a semiconductor device, having a supporting body on a surface of which a pattern of conductors is provided by using the method according to the invention, in particular a semiconductor device comprising a transistor having an emitter metallization and a base metallization of different compositions and/or thicknesses.

Figure 2:
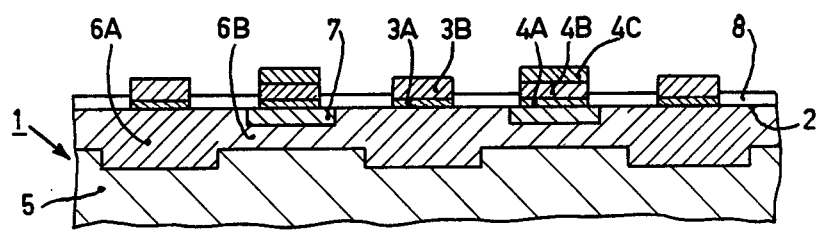
Figure 3:
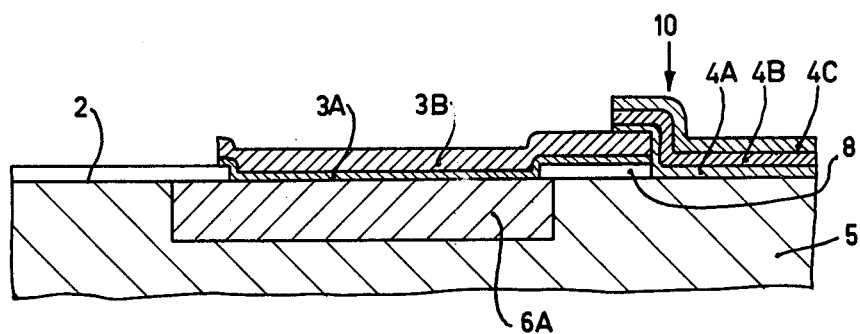
Figure 4:
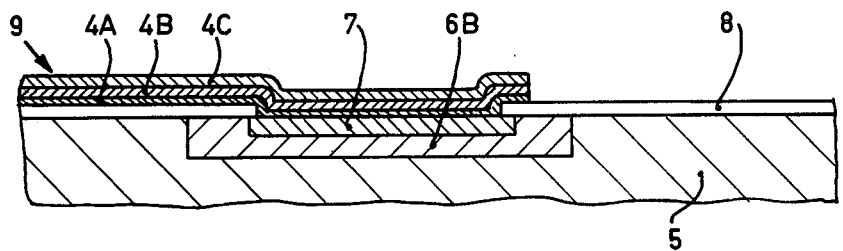
Figure 8:
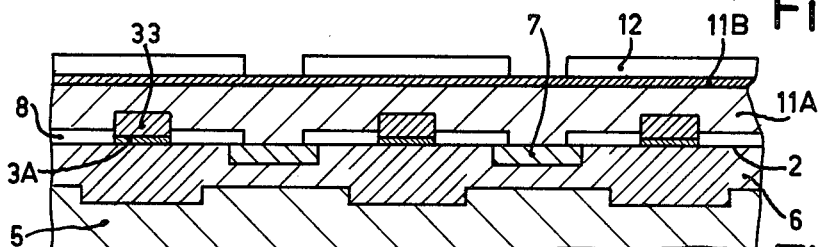
Figure 9:
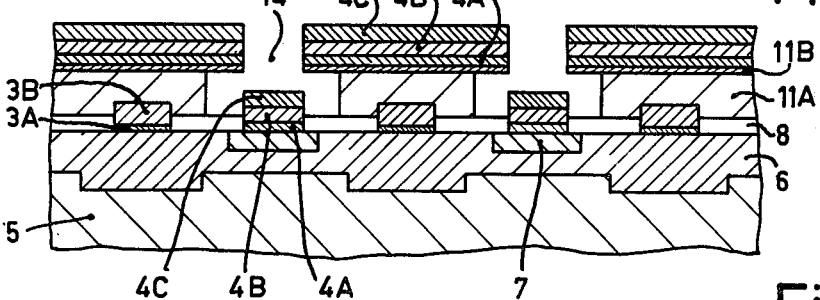
Figure 10:
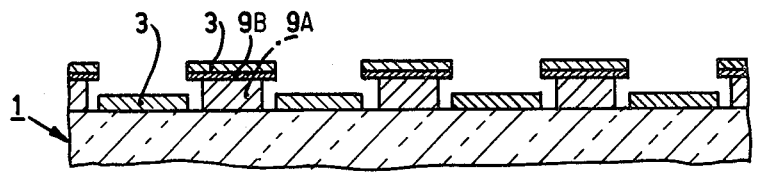
Figure 11:
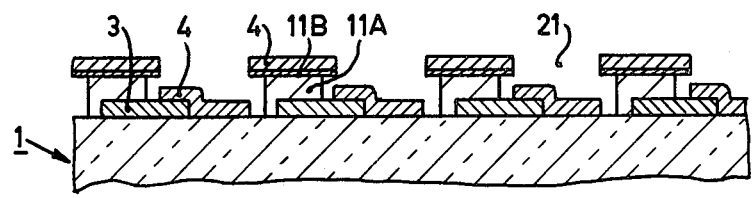
Figure 12:
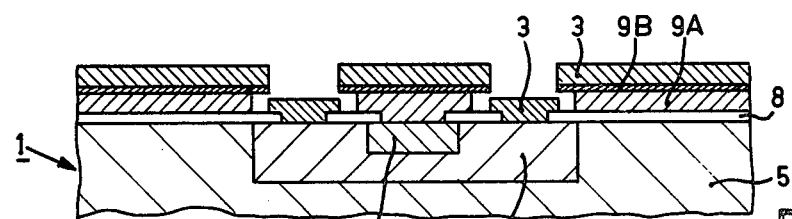
Figure 13:
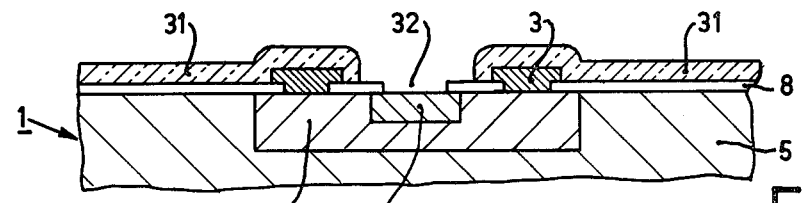
Figure 14:
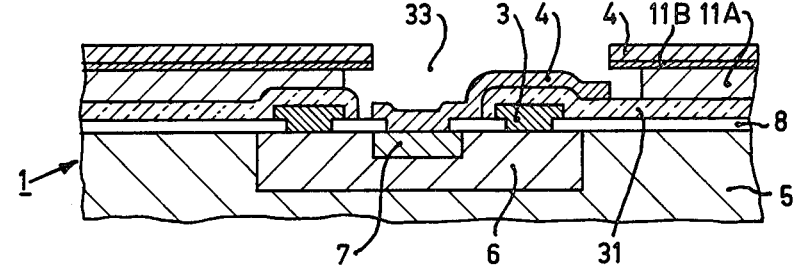

The invention will now be described in greater detail with reference to a few embodiments and the drawing in which:

FIG. 1 is a diagrammatic plan view of a device manufactured by using the method according to the invention, FIGS. 2, 3, and 4 are diagrammatic cross-sectional views of the device taken on the lines II—II, III—III, and IV—IV of FIG. 1, FIGS. 5 to 9 are diagrammatic cross-sectional views taken on the line II—II of the device shown in FIG. 1 in successive stages of manufacture, FIGS. 10 and 11 are diagrammatic cross-sectional views of another device manufactured by using the method according to the invention in successive stages of manufacture, FIGS. 12, 13 and 14 are diagrammatic cross-sectional views of a further device also manufactured by using the method according to the invention is successive stages of manufacture.

Figure 15:
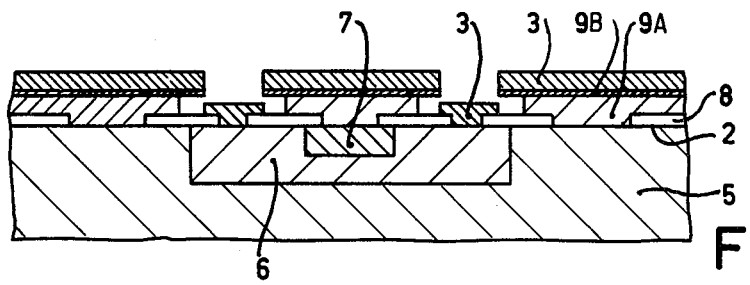
Figure 16:
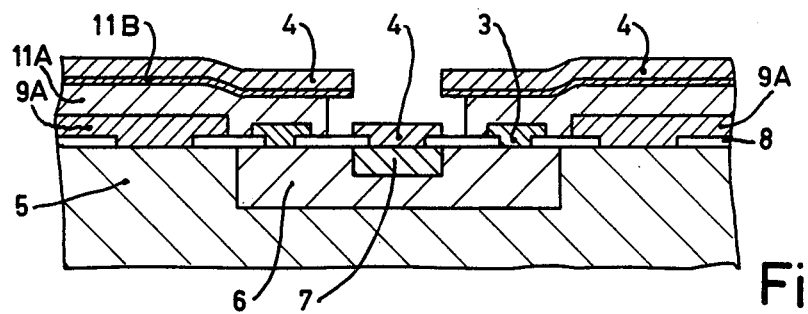
Figure 17:
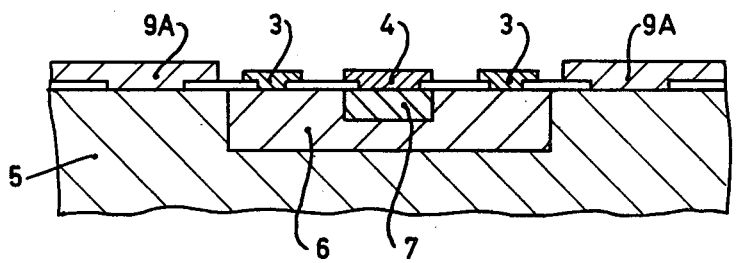
Figure 18:
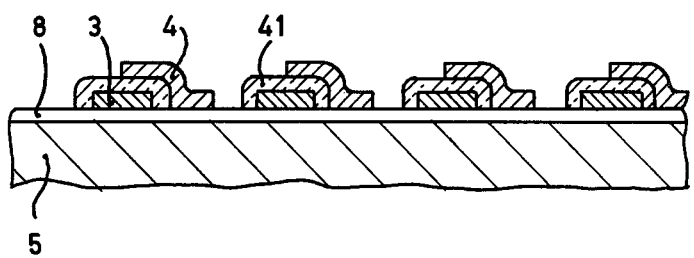

FIGS. 15, 16 and 17 are diagrammatic cross-sectional views of still another device by using the method according to the invention in successive stages of manufacture, and FIG. 18 is a diagrammatic cross-sectional view of a variation shown in FIG. 11.

The drawings are diagrammatic and not drawn to scale for clarity. Corresponding parts are referred to by the same reference numerals as much as possible in the various Figures. Insulating layers, for example oxide layers, on the surface are shown in constant thickness for simplicity, although dependent upon the way of manufacturing the device, this need not be the case. Semiconductor zones of the same conductivity type are as a rule shaded in the same direction.

FIG. 1 is a disgrammatic plan view and FIGS. 2, 3 and 4 are diagrammatic cross-sectional views taken on the line II—II, III—III and IV—IV, of FIG. 1 of a device, in this case a semiconductor device, having a supporting body 1 in the fom of a silicon wafer on which a pattern of conductors is provided which comprises the metal layers 3 and 4. The strip-shaped metal layers 3 form the base metallization and the strip-shaped metal layers 4 form the emitter metallization of a high frequency transistor the collector zone 5, the base zone 6 and the emitter zone 7 of which are shown diagrammatically in FIGS. 2, 3 and 4. The boundary of the base zone 6 is shown in broken lines in FIG. 1. In this example, the zones 5 and 7 are deemed to be n-type conductive and the zone 6 p-type conductive but, of course, this may also be reversed. The base zone is composed of highly doped strip-shaped p-type regions 6A on which the base metallization 3 is provided and intermediately located lower doped and less deep regions 6B in which the emitter zones 7 are present. The collector zone 5 is contacted in the usual manner on the lower side of the silicon wafer; this is not shown in detail in the Figures. The transistor may be a discrete transistor but the device may also be a monolithic integrated circuit, in which case other circuit elements occur on or in the silicon wafer in addition to the transistor; the collector zone 5 in that case may, for example, also be contacted at the surface 2. Except at the area of the emitter and base contact windows, the semiconductor surface is covered at least in the active area of the device with an electrically insulating layer 8 of silicon oxide. In the drawings the thickness of said layer 8 is shown to be equal everywhere although in practice this need by no means be the case. Outside the active part of the transistor, the emitter and base metallization is connected to an emitter contact surface 9 and a base contact surface 10, see FIG. 1, via slightly widened parts of the strip-shaped metal layers 3 and 4 present on the oxide layer 8.

This high frequency transistor is distinguished from known high frequency transistors inter alia by the very small intermediate space between the emitter metallization 4 and the base metallization 3. The interdigitating emitter and base metal layers, the outer base metal strips excepted, have a width of approximately 2 microns and an intermediate space of approximately 1 micron. This very small intermediate space can be achieved by using the invention and may even be reduced, if desired, to less than 1 micron.

A further distinction between the described transistor and the known transistors is that in the transistor shown in FIGS. 1 to 4 the emitter metallization 4 has a different composition and is thicker than the base metallization 3. In this example the emitter metallization consists of a 0.1 micron thick layer 4A of titanium (this may also be, for example, chromium, rhodium, cobalt, tantalum, zirconium, tungsten or molybdenum), a 0.15 micron thick layer 4B of platinum present thereon (this may also be, for example, rhodium, cobalt, molybdenum or tungsten), and a 0.7 micron thick layer 4C of gold. The base metallization which need convey less current and hence need also be less readily conductive consists of a 0.1 micron thick layer 3A of titanium (this may also be, for example, chromium, rhodium, zirconium, tantalum, tungsten or molybdenum) and a 0.3 micron thick layer 3B of platinum (this may also be, for example, rhodium, cobalt, molybdenum or tungsten). Another advantage is that there is no gold on the base metallization which, due to the frequently occurring "spikes", notably in p-diffusions, might readily diffuse into the base zone, while the readily conductive gold can nevertheless be used in the emitter metallization.

According to the invention, the transistor described with reference to FIGS. 1 to 4 and which has very good high frequency properties is manufactured as follows. FIGS. 5 to 9 are diagrammatic cross-sectional views taken on the line II—II of FIG. 1 in various stages of manufacture.

Figure 5:
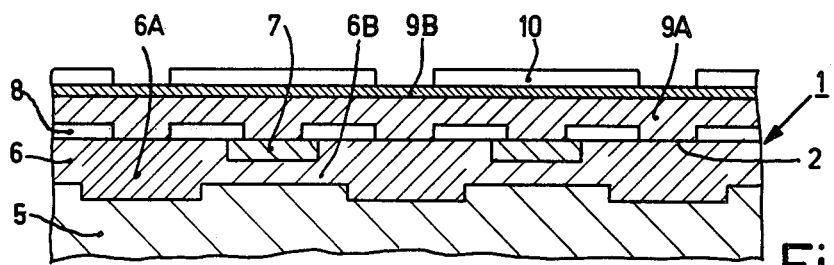
Figure 6:
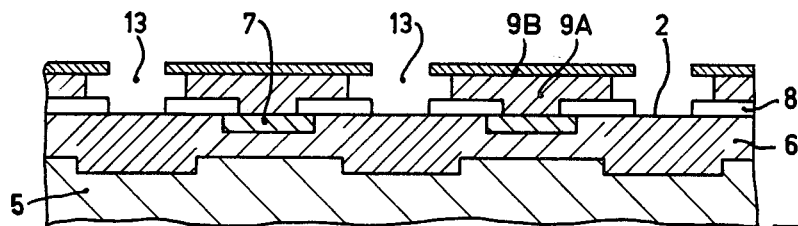
Figure 7:
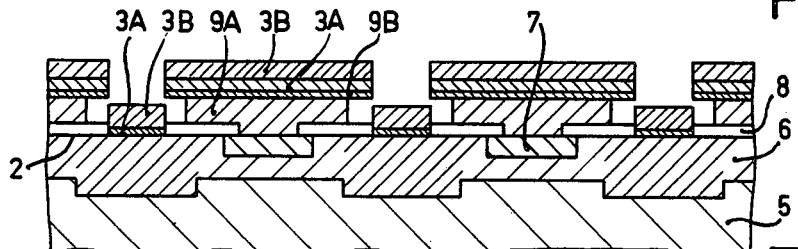

FIG. 5 shows a part of a supporting body in the form of a silicon wafer having an n-type collector zone 5, a for example diffused or implanted p-type base zone 6 with highly doped contact strips 6A and lower doped active parts 6B in which n-type conductive, for example, diffused or implanted, emitter zones are provided. Over the assembly there is an insulating layer, for example a silicon oxide layer 8, having base and emitter contact windows. This structure can be manufactured in known manner conventionally used in semiconductor technology by means of photolithographic masking and doping methods. Since the process steps used in said methods are known and do not relate to the invention they are not described in detail here.

The base and emitter metallization is now provided according to the invention as follows. First (see FIG. 5) a first auxiliary layer 9A,B is provided over the assembly. Although it is possible in principle to provide a single auxiliary layer, an auxiliary layer 9 is provided in this example which consists of a first component auxiliary layer 9A of, for example, aluminium or copper, thickness approximately 0.5 micron, and thereon a second component auxiliary layer 9B differing from the layer 9A of, for example, titanium in a thickness of approximately 0.2 micron. Instead of aluminium or copper, silver or magnesium may also be used advantageously for the layer 9A and instead of titanium, for example, chromium, palladium, molybdenum, tungsten, tantalum, nickel or gold may also be used advantageously for the layer 9B.

An etching mask, for example a photoresist mask 10, is then provided in the usual manner on the layer 9B, so that the structure shown in FIG. 5 is obtained. The apertures in the photoresist mask are present at the area of the base metallization to be provided.

Apertures 13 (see FIG. 6) corresponding to the base metallization to be provided are then etched in the auxiliary layer 9 A, B. First, while using the photoresist mask 10, apertures are provided in the titanium layer 9B, for example, by etching with an aqueous solution of HF, or by sputter etching. A slight underetching below the photoresist mask 10 occurs, which effect, however, is only small as a result of the small thickness of the layer 9B and is not shown in the Figures. By means of an etchant which does not attack the layer 9B, the layer 9A is then etched away down to the semiconductor surface (for example, aluminium with phosphoric acid, copper with dilute $HNO_3$). The photoresist mask remains. The photoresist mask may also be removed previously, in which case the thin layer 9B serves as a mask, while the layer 9B is etched away laterally below the edges of the layer 9B over a distance which is approximately equal to the thickness of the layer 9A, see FIG. 6. Said underetching can still be intensified by electrochemical effects occurring by the contact between the etchant and the metals of the auxiliary layer, and said underetching is of advantage in the subsequent processes, as will become apparent hereinafter; also if an underetching of less than the thickness of the layer 9A would be obtained, this would already be sufficient.

A 0.1 micron thick titanium layer 3A and a 0.3 micron thick layer 3B of a different metal, for example, a platinum layer or rhodium layer, are then successively provided over the assembly, for example, by vapour deposition from the gaseous phase under reduced pressure or by sputtering, in a direction transverse to the surface 2, preferably at elevated temperature (300° – 400° C). The layer 3A may also consist, for example, of chromium, rhodium, tantalum, zirconium, molybdenum or tungsten, the layer 3B (differing therefrom) may also consist of rhodium, cobalt, molybdenum, cobalt or tungsten. Due to a high vapour deposition temperature, a good adhesion and a good metal-to-semiconductor contact are obtained. As a result of the said underetching and since the auxiliary 9A, B is thicker than the overall thickness of the layers 3A and 3B, no connection is formed between the parts of the layers 3A and 3B deposited on the layer 9B and the parts deposited in the apertures of the auxiliary layer on the semiconductor surface, see FIG. 7.

The layer 9A is now dissolved without masking in an agressive etching liquid, (for example, $FeCl_3$ for Al, HNO₃ for Cu), in which also the layer 9B present thereon and parts of the layers 3A and 3B present thereon are removed. Since the etchant used in such that it does not attack the layers 3A and 3B, same remain on the semiconductor surface as a base metallization. Therewith a first part of the pattern of conductors is obtained.

The emitter metallization could have been provided in the same operation and with the same metals as conductors. In this manner, however, the intermediate spaces between the strip-shaped emitter and base metal layers cannot be made arbitrarily small. As is obvious, for example, from FIG. 7, the smallest distance in the example described between two adjacent base metal layers is restricted by the underetching of the layer 9A which cannot be made arbitrarily small and is determined by the thickness of the layer 9A which itself again is preferably larger than the thickness of the metallization to be provided. In embodiments of the process in which the metal layers 3A and B cohere prior to the removal of the auxiliary layer 9A, B, even more stringent restrictions hold good, since, as a result of the tearing occurring upon removing the auxiliary layer, larger irregularities occur at the edges of the metallization.

In order to obtain the desired very small intermediate space between the base metallization and the emitter metallization, according to the invention a second auxiliary layer 11A, B of a material differing from that of the first conductive layer 3A, B is provided over the assembly after removing the first auxiliary layer 9A, B, see FIG. 8. This may be composed in the same manner as the first auxiliary layer 9A, B, although this is by no means necessary. In this embodiment the first component auxiliary layer 11A again consists of aluminum or copper with a thickness of 1.1 microns and generally is thicker than the overall thickness of the emitter metallization to be provided, for the already above-mentioned reasons. The second component auxiliary layer 11B consists of titanium and has a thickness of approximately 0.2 micron. A photoresist mask 12 is again provided on the layer 11B and has apertures at the area of the emitter metallization to be provided. It is in general desired to ensure that the auxiliary layer 11A,B does not form a metallurgical compound with the first part 3A,B of the pattern of conductors at the temperature at which it is provided.

In the same manner as described above for the first auxiliary layer 9A, B, further apertures 14 which correspond to the emitter metallization to be provided are now provided in the second auxiliary layer 11A, B, see FIG. 9. Underetching of the layer 11A occurs again. Simultaneously with the provision of the apertures 14, an aperture in the second auxiliary layer 11A, B is preferably also made above at least a part of the base metallization so as to provide the base contact surface 10 also with the emitter metallization (see FIG. 3) and thus to obtain a readily solderable layer of gold as uppermost layer. However, this is not necessary. A second conductive layer 4A, B, C of a material differing from that of the second auxiliary layer 11A, B is now provided over the second auxiliary layer 11A, B. It consists in this example of a layer 4A of titanium, 0.1 micron thick, a layer 4B of platinum, 0.15 micron thick, and a layer 4C of gold, 0.7 micron thick. Chromium, rhodium, zirconium, tantalum, tungsten or molybdenum may also be used, for example, for the layer 4A. Rhodium, cobalt, molybdenum or tungsten may also be used, for example, for the layer 4B which differs from the layer 4A.

Just as during the provision of the base metallization, the second auxiliary layer 11A, B with the part of the second conductive layer 4A, B, C present thereon is then removed selectively by agressive etching of the layer 11A, the parts on the layer 4A, B, C remaining in the apertures forming a second part of the pattern of conductors, the emitter metallization.

Herewith the transistor shown in FIGS. 1 to 4 has been obtained which can be assembled further in the usual manner. A particular characteristic feature of the resulting transistor is that also on the base contact surface 10 the emitter metallization is present at least partly on the base metallization. A transistor having this characteristic feature can also be obtained with other methods in which the emitter and base metallizations are provided in separate steps. An important advantage is that the solderability of the base contact surface is improved. Soldering is to be understood to mean herein in a wide sense any method with which a connection conductor can be provided on a contact surface, for example, by means of a soldering material, by thermocompression bonding, by ultrasonic welding, and so on. It is not necessary for the emitter metallization to consist of a conductive material differing from that of the base metallization.

Since the aperture 14 can be provided quite independently of the place of the base metallization, the emitter metallization may be provided arbitrarily closely to the base metallization. The accuracy and the reproducibility with which this occurs depend upon the accuracy with which the mask 12 can be aligned relative to the base metallization. A distance of 1.5 to 1 micron or less between emitter and base metallization, as in the transistor described, can easily be realized with the method according to the invention. Since the metallization is carried out in at least two steps, the second metallization, in this case the emitter metallization, may also have a quite different composition than the first metallization, the base metallization.

In the embodiment described, the lower component auxiliary layer (9A, 11A) was etched away to remove the auxiliary layers. Instead of this, both component auxiliary layers may also be etched away from each auxiliary layer, or only the uppermost layers 9B and 11B, respectively, the lower component auxiliary layers 9A and 11A, respectively, remaining, however. In certain circumstances, however, for example, when they form a further part of the pattern of conductors, this may be useful as will be demonstrated in one of the following examples.

It will furthermore be obvious, that a third, a fourth part, and so on of the pattern of conductors can be formed by using the described process, known as "lift off" process, for a third and a fourth time. The invention is therefore by no means restricted to only two applications of this process; the essence of the invention resides in the fact that considerable advantages can be obtained by using such a "ligt off" process not once but repeatedly. Besides, as described in the above embodiment, the invention may be used in many different forms. This will be illustrated with reference to a few other embodiments.

FIGS. 10 and 11 are diagrammatic cross-sectional views of another device in two stages of manufacture by using the method according to the invention. In this method, a pattern of conductors consisting of two conductive layers 3 and 4 is provided on a supporting body 1 which may have any composition. The first part 3 of the pattern is provided in a manner analogous to that of the preceding example by using a first auxiliary layer 9A, B. The meterials of the auxiliary layer and the way of etching may be the same as described in example of FIGS. 1 to 9. After removing the auxiliary layer 9A, B with the metal layer parts 3 present thereon, a second auxiliary layer 11A, B is provided in which, however, apertures 21 are provided this time which overlap the first metal layer 3 partly. After providing a second metal layer 4 (see FIG. 11) and removing the layer 11A, B with the metal layer parts present thereon, a pattern of conductors has been obtained the two parts 3 and 4 of which overlap each other partly. The advantage of this method is that only one edge of the etching mask which determines the apertures 21 need be aligned very accurately relative to the first part 3 of the pattern of conductors, while the place of the other edge is less critical so that the mask in question has a slightly larger tolerance in a certain respect.

FIGS. 12, 13 and 14 are diagrammatic cross-sectional views of a transistor in successive stages of manufacture, which transistor is shown very simply with a collector zone 5, a base zone 6 and an emitter zone 7, although in practice the geometry may of course be much more complicated. As is usual an oxide layer 8 is provided on the semiconductor surface with emitter and base contact windows. First the base metallization 3 is provided by using a first auxiliary layer 9A, B (see FIG. 12). After removing the first auxiliary layer 9A, B, a glass layer 31 in which an emitter window 32 is etched is then provided over the assembly (see FIG. 13). A second auxiliary layer 11A, B is then provided over the assembly in which an aperture 33 is again made, for example, in the above-described manner. It will be obvious that the etchants used may not attack the glass layer 31. The emitter metallization 4 is then provided (see FIG. 14), in which, after removing the second auxiliary layer 11A, B, a transistor has been obtained of a very compact structure in which the emitter metallization 4 is present partly above the base metallization 3 and is separated therefrom by the glass layer 31.

FIGS. 15 to 17 illustrate a method in which a part 9A of at least the first auxiliary layer 9A, B is not removed but is used as a part of the pattern of conductors. FIG. 15 is again a diagrammatic cross-sectional view of a transistor having a collector zone 5, a base zone 6 and an emitter zone 7, in which the surface 2 of the semiconductor wafer is covered with an insulating layer 8 having emitter and base windows. In this case the collector connection is also provided on the surface 2 so that a collector contact window is also etched in the layer 8.

The base metallization 3, in this example of rhodium, is again provided by means of an auxiliary layer 9A, B having apertures at the area of the base contact windows, see FIG. 15. The layer 9A consists in this example of tungsten or polycrystalline silicon, the layer 9B consists of palladium. After providing the first auxiliary layer 9A, B first the palladium layer 9B is provided in the desired shape photolithographically, after which apertures are etched in the first component auxiliary layer 9A by means of an etchant which does substantially not attack the layer 9B (for example ferrocyanide-etchant for tungsten, HNO$_3$ + HF for polycrystalline silicon). Underetching occurs below the edges of the layer 9B over a lateral distance approximately equal to the thickness of the layer 9A. Then the rhodium layer 3 is provided, after which the second component auxiliary layer 9B of palladium and the parts of the metal layer 3 present thereon are removed by means of an etchant which does substantially not attack the layers 3 and 9A (in this case water + hydrogen, which causes the palladium layer to wrinkle), while the layer 9A remains substantially unattacked. The layer 9A is connected to the collector zone via the collector contact window and serves as a collector metallization.

The central part of the layer 9A present above the emitter zone 7 is then etched away for which purpose a not critical mask may be used. The emitter metallization is then provided in the manner described in the preceding examples while using the second auxiliary layer 11A, B which in this case is removed entirely after providing the emitter metal 4, but, if desired, the lower component layer 11A may in this case also be used for further metallizations.

It will be obvious that the invention is not restricted to the embodiments described by way of example, but that many variations are possible to those skilled in the art without departing from the scope of this invention. For example, instead of by a semiconductor body which is partly or entirely covered with an insulating layer, the substrate may be formed by an electrically insulating material. It may be an insulating layer, for example a silicon oxide or silicon nitride layer or a composite insulating layer which is present on a semiconductor surface. By providing, as in FIGS. 12-13, an insulating layer on the first auxiliary layer, electrodes can be obtained which are present very close together; in this manner, for example, a very compact electrode structure as shown in FIG. 18 may be obtained in which the electrodes 3 and 4 which overlap each other are separated from each other by an insulating layer 41. This may have been obtained, for example, by deposition or by oxidation, for example, thermal oxidation, of the pattern of conductors 3 which for that purpose may consist, for example, of aluminium or polycrystalline silicon. The pattern of electrodes (3, 4) of FIG. 18 is provided, for example, on an oxide layer 8 which extends over an n-type silicon substrate 5 and is used, for example, in charge-coupled devices. The pattern of conductors may consist entirely of partly of semiconductors, for example, doped or non-doped polycrystalline silicon instead of metals, while the geometry of the examples shown in the drawing can be varied within wide limits.

Finally it is pointed out that the auxiliary layer and auxiliary layers, respectively, need not necessarily be metal but may also consist of other materials. For example, an auxiliary layer may also consist entirely or partly of a hardened photoresist. The effect obtained in the examples described by underetching may be produced, for example, by exposing the photoresist layer to light via a suitable mask at such an angle that parts of the photoresist present below the edge of the mask are also exposed to light and can be removed by a developer.

What is claimed is:

1. A method of manufacturing a pattern of conductors on a surface of a supporting body comprising the steps of sequentially:

forming a first auxiliary layer on the surface of said body, said first auxiliary layer having one or more first apertures which correspond to at least a part of said pattern of conductors;

forming a layer of electrically conductive material on a surface of said first auxiliary layer most remote from said body and in said first apertures;

selectively removing at least said surface of said first auxiliary layer together with the conductive material present thereon, whereby a first part of said pattern of conductors is produced;

forming a second auxiliary layer of material differing from said first conductive material on the surface of said body; said second auxiliary layer having one or more second apertures which correspond to at least a part of said pattern of conductors;

forming a second layer of electrically conductive material on a surface of said second auxiliary layer most remote from said body and in said second apertures; and selectively removing at least said surface of said second auxiliary layer and said electrically conductive material thereon; whereby additional portions of said pattern of conductors are produced.

2. The method of claim 1 wherein at least one of said auxiliary layers is a metal layer.

3. The method of claim 1 wherein at least one of said auxiliary layers has a thickness greater than that of the conductive layer provided thereon.

4. The method of claim 1 wherein said supporting body is a semiconductor.

5. The method of claim 1 wherein said second apertures are at least partially disposed between said first apertures.

6. The method of claim 1 further including the steps of sequentially:

forming one or more additional auxiliary layers of materials different from previously deposited conductive layers and having additional apertures therein;

forming additional layers of electrically conductive material on a surface of each of said additional auxiliary layers most remote from said body and in said additional apertures; and selectively removing at least said surfaces of said additional auxiliary layers and the conductive material thereon, whereby additional portions of said pattern are provided.

7. A method as claimed in claim 1, wherein one or more of said auxiliary layers comprises a layer of a material selected from the group consisting of aluminum, copper, silver and magnesium.

8. A method as claimed in claim 1, wherein at least one of said conductive layers comprises at least two conductive component layers, disposed one on top of the other, which comprise different materials.

9. A method as claimed in claim 8, wherein a lower of said conductive component layers consists of a layer of a material selected from the group consisting of titanium, chromium, rhodium, zirconium, tantalum, tungsten and molybdenum.

10. A method as claimed in claim 8, wherein the uppermost of said conductive component layers consists of a layer of gold.

11. A method as claimed in claim 10, wherein a layer of a material selected from the group consisting of chromium and titanium is disposed beneath said layer of gold, a layer of a material selected form the group consisting of platinum and rhodium being formed therebetween.

12. A method as claimed in claim 1, wherein:

at least the second auxiliary layer comprises a third component auxiliary layer and a fourth component auxiliary layer of mutually different materials, said third component auxiliary layer being disposed between the surface of said body and the fourth component auxiliary layer and consisting of a metal which is soluable in an etchant which does not substantially attack the second layer of conductive material; and the apertures in the third component auxiliary layer become larger than those in the fourth component auxiliary layer by a process of under-etching.

13. A method as claimed in claim 12, wherein:

the first auxiliary layer comprises a first component auxiliary layer and a second component auxiliary layer of mutually different materials, the first component auxiliary layer being disposed between the surface of the body and the second component auxiliary layer and consisting of a metal which is soluable in an etchant which does not substantially attack the first conductive layer; and the apertures in the first component auxiliary layer become larger than those in the second component auxiliary layers by a process of under-etching.

14. A method as claimed in claim 13, wherein one or both of the second and fourth component auxiliary layers are metal layers which serve as etching masks for underlying component auxiliary layer.

15. A method as claimed in claim 13, wherein one or both of the second and fourth component auxiliary layers are thinner than the underlying component auxiliary layer.

16. A method as claimed in claim 13, wherein one or both of said second component auxiliary layer and said fourth component auxiliary layer comprises a layer of a material selected from the group consisting of chromium, titanium, palladium, molybdenum, tungsten, tantalum, nickel and gold.

17. A method as claimed in claim 13, wherein the first component auxiliary layer is an electrically conductive material which contacts surface parts of the supporting body and is not removed, at least from said surface parts, thus forming a further part of said pattern of conductors.

18. A method as claimed in claim 1, wherein the conductive layers which form the pattern of conductors are produced from a gaseous phase at a reduced pressure and in a direction transverse to the surface of said supporting body.

19. A method as claimed in claim 1, wherein after removing at least the surface of said first auxiliary layer, an insulating layer is formed over the assembly, on which insulating layer the second auxiliary layer is then formed.

20. A method as claimed in claim 4, wherein a portion of the pattern of conductors is formed on an insulating layer disposed on a surface of the semiconductor and a further portion of said pattern of conductors is formed in one or more apertures in the insulating layer.

21. A method as claimed in claim 4, wherein a first part of the pattern of conductors forms the base metallization of a transistor and a second part of the pattern of conductors forms the emitter metallization of said transistor.

* * * * *